United States Patent

Arya

[11] Patent Number: 6,121,541
[45] Date of Patent: *Sep. 19, 2000

[54] MONOLITHIC MULTI-JUNCTION SOLAR CELLS WITH AMORPHOUS SILICON AND CIS AND THEIR ALLOYS

[75] Inventor: Rajeewa R. Arya, Jamison, Pa.

[73] Assignee: BP Solarex, Frederick, Md.

[*] Notice: This patent is subject to a terminal disclaimer.

[21] Appl. No.: 08/900,160

[22] Filed: Jul. 28, 1997

[51] Int. Cl.$^7$ .................. H01L 31/0376; H01L 31/0392; H01L 31/0272

[52] U.S. Cl. .......................... 136/255; 136/258; 136/262; 136/264; 136/249; 257/184

[58] Field of Search ................................. 136/255, 258, 136/261, 262, 264, 249; 257/184, 200

[56] References Cited

U.S. PATENT DOCUMENTS

| | | | |
|---|---|---|---|
| 4,057,439 | 11/1977 | Lindmayer | 136/89 |
| 4,064,521 | 12/1977 | Carlson | 357/2 |
| 4,093,473 | 6/1978 | Lindmayer | 136/89 |
| 4,139,399 | 2/1979 | Lindmayer | 136/89 |
| 4,142,195 | 2/1979 | Carlson et al. | 357/15 |
| 4,163,677 | 8/1979 | Carlson et al. | 136/89 |

(List continued on next page.)

FOREIGN PATENT DOCUMENTS

| | | | |
|---|---|---|---|
| 63-41082 | 8/1986 | Japan . | |
| 63-41082 | 2/1988 | Japan | H01L 31/04 |
| 63041082 | 2/1999 | Japan | H01L 31/04 |

OTHER PUBLICATIONS

U.S. application No. 09/654,321, Carlson et al., filed Jul. 24, 1998.

"Performance and Long–Term Reliability of Multijunction Amorphous Silicon Photovoltaic Modules", by D.E. Carlson, R.R. Arya, and R. Romero, published by International Semiconductors. Device Research Symposium, Dec. 10–13, 1997.

"Commercialization of Multijunction Amorphous Silicon Modules" by D.E. Carlson, R.R. Arya, M. Benett, L.F. Chen, K.. Jansen, Y.M. Li, Newton, K. Rajan, R. Romero, D. Talenti, E. Twesme, F. Willing and L. Yang at Solarex, a Business Unit of Amoco/Enron Solar, Newtown, PA, presented at $25^{th}$ IEEE PVSC, May 13–17, 1996.

*Primary Examiner*—Ellis Robinson
*Assistant Examiner*—Michael C. Miggins
*Attorney, Agent, or Firm*—Welsh & Katz, Ltd.; Thomas W. Tolpin

[57] ABSTRACT

Efficient broader spectrum monolithic solar cells are produced by coupling a CIS or CIGS polycrystalline semiconductor to an amorphous silicon semiconductor. Coupling can be accomplished with a n-type conductor, such as cadmium sulfide or microcrystalline n-doped amorphous silicon. Cadmium sulfide can be deposited on the CIS or CIGS polycrystalline semiconductor by solution growth, sputtering or evaporation. A transparent conductive oxide can be deposited on the cadmium sulfide by low pressure chemical vapor deposition. The microcrystalline n-doped amorphous silicon and the amorphous silicon semiconductor can be deposited by enhanced plasma chemical vapor deposition. The amorphous silicon can comprise: hydrogenated amorphous silicon, hydrogenated amorphous silicon carbon, or hydrogenated amorphous silicon germanium. Triple junction solar cells can be produced with an amorphous silicon front cell, an amorphous silicon germanium middle cell, and a CIS or CIGS polycrystalline back cell, on a substrate.

5 Claims, 1 Drawing Sheet

U.S. PATENT DOCUMENTS

| | | | |
|---|---|---|---|
| 4,167,015 | 9/1979 | Hanak | 357/16 |
| 4,200,473 | 4/1980 | Carlson | 136/89 |
| 4,256,681 | 3/1981 | Lindmayer | 264/85 |
| 4,272,641 | 6/1981 | Hanak | 136/249 |
| 4,292,461 | 9/1981 | Hovel | 136/249 |
| 4,317,844 | 3/1982 | Carlson | 427/39 |
| 4,330,582 | 5/1982 | Lindmayer | 428/64 |
| 4,335,266 | 6/1982 | Mickelson et al. | 136/260 |
| 4,339,470 | 7/1982 | Carlson | 427/39 |
| 4,360,702 | 11/1982 | Feng et al. | 136/261 |
| 4,366,335 | 12/1982 | Feng et al. | 136/255 |
| 4,366,336 | 12/1982 | Donaghey | 136/256 |
| 4,532,371 | 7/1985 | Hanak et al. | 136/249 |
| 4,611,091 | 9/1986 | Choudary et al. | 136/260 |
| 4,638,111 | 1/1987 | Gay | 136/249 |
| 4,686,323 | 8/1987 | Biter et al. | 136/249 |
| 4,690,830 | 9/1987 | Dickson et al. | 427/38 |
| 4,718,947 | 1/1988 | Arya | 136/258 |
| 4,795,501 | 1/1989 | Stanbery | 136/249 |
| 4,909,863 | 3/1990 | Birkmire et al. | 148/33.4 |
| 4,914,044 | 4/1990 | Grabmaier et al. | 437/4 |
| 4,926,229 | 5/1990 | Nakagawa et al. | 357/30 |
| 4,948,740 | 8/1990 | Plaettner | 437/4 |
| 5,015,503 | 5/1991 | Varrin, Jr. et al. | 427/255.2 |
| 5,045,409 | 9/1991 | Eberspacher et al. | 428/620 |
| 5,104,455 | 4/1992 | Yokota et al. | 136/249 |
| 5,112,409 | 5/1992 | Warfield et al. | 136/256 |
| 5,125,984 | 6/1992 | Kruehler et al. | 136/255 |
| 5,164,020 | 11/1992 | Wagner et al. | 136/251 |
| 5,180,690 | 1/1993 | Czubatyj et al. | 437/233 |
| 5,230,746 | 7/1993 | Wiedeman et al. | 136/249 |
| 5,244,509 | 9/1993 | Arao et al. | 136/259 |
| 5,246,506 | 9/1993 | Arya et al. | 136/249 |
| 5,256,887 | 10/1993 | Yang | 257/53 |
| 5,403,404 | 4/1995 | Arya et al. | 136/249 |
| 5,479,043 | 12/1995 | Nuyen | 257/459 |
| 5,593,901 | 1/1997 | Oswald et al. | 437/2 |
| 5,646,050 | 7/1997 | Li et al. | 437/4 |
| 5,720,826 | 2/1998 | Hayashi et al. | 136/249 |
| 5,730,808 | 3/1998 | Yang et al. | 136/249 |

MONOLITHIC MULTI-JUNCTION SOLAR CELLS WITH AMORPHOUS SILICON AND CIS AND THEIR ALLOYS

BACKGROUND OF THE INVENTION

This invention pertains to photovoltaic devices and more particularly to multi-junction solar cells fabricated of amorphous silicon and copper indium diselenide and their alloys.

Over the years numerous solar cells have been developed which have met with varying degrees of success. Single junction solar cells are useful but often cannot achieve the power and conversion efficiency of multi-junction solar cells. Unfortunately, multi-junction solar cells and single junction solar cells have been constructed of various materials which are able to capture and convert only part of the solar spectrum into electricity. Multi-junction solar cells have been produced with amorphous silicon and its alloys, such as hydrogenated amorphous silicon carbon and hydrogenated amorphous silicon germanium, with wide and low bandgap intrinsic i-layers. Amorphous silicon solar cells have a relatively high open circuit voltage and low current but can only respond to capture and convert into electricity wavelengths of sunlight from 400 to 900 nanometers (nm) of the solar spectrum.

Copper indium disclenide (CIS) polycrystalline solar cells have a relatively low bandgab of approximately 1 eV and are able to respond, capture and convert into electricity a great spectrum of sunlight from 400 to 1350 nm. Copper indium diselenide solar cells can generate more current but at lower voltage than amorphous silicon solar cells and their alloys. Copper indium diselenide polycrystalline solar cells, however, generally are more temperature dependent than amorphous silicon solar cells and can lose as much as 60% of their power at higher temperatures in a manner somewhat similar to polycrystalline silicon solar cells.

The segments, layers or cells of multi-junction solar cells are electrically interconnected, such as by laser scribing. High current CIS polycrystalline solar cells generate greater power losses ($I^2R$) due to the resistance at the front and rear contacts, e.g. tin oxide contacts, than do amorphous silicon solar cells. Such power losses can be partially overcome by laser scribing more scribe lines and dividing the solar cell into smaller segments, such as 60 segments of 1 cm width. More scribe lines, however, decreases the active area of utilization of the solar cell which is available to capture and convert solar energy into electricity. Furthermore, deviations, voids and imperfections in the composition of polycrystalline can adversely effect the performance of polycrystalline solar cells.

Current output of a photovoltaic device is maximized by increasing the total number of photons of differing energy and wavelength which are absorbed by the semiconductor material. The solar spectrum roughly spans the region of wavelength from about 300 nanometers to about 2200 nanometers, which corresponds to from about 4.2 eV to about 0.59 eV, respectively. The portion of the solar spectrum which is absorbed by the photovoltaic device is determined by the size of the bandgap energy of the semiconductor material. Crystalline silicon (c-Si) has a bandgap energy of about 1.1 eV. Solar radiation (sunlight) having an energy less than the bandgap energy is not absorbed by the semiconductor material and, therefore, does not contribute to the generation of electricity, current, voltage and power, of the photovoltaic device.

Solar cells and other photovoltaic devices convert solar radiation and other light into usable electrical energy. The energy conversion occurs as the result of the photovoltaic effect. Solar radiation (sunlight) impinging on a photovoltaic device and absorbed by an active region of semi-conductor material, e.g. an intrinsic i-layer of amorphous silicon, generates electron-hole pairs in the active region. The electrons and holes are separated by an electric field of a junction in the photovoltaic device. The separation of the electrons and holes by the junction results in the generation of an electric current and voltage. The electrons flow toward the region of the semiconductor material having an n-type conductivity. The holes flow toward the region of the semiconductor material having a p-type conductivity. Current will flow through an external circuit connecting the n-type region to the p-type region as long as light continues to generate electron-hole pairs in the photovoltaic device.

Single-junction devices comprise three layers. These are p- and n-layers which are extrinsic or doped and i-layer which is intrinsic or undoped (at least containing no intentional doping). The i-layer is much thicker than the doped layers. This is because mainly light absorbed in the i-layer is converted to electrical power which can be used in an external circuit. The thickness of the i-layer (sometimes called the absorber layer) determines how much light is absorbed. When a photon of light is absorbed in the i-layer it gives rise to a unit of electrical current (an electron-hole pair). However, this electrical current will go nowhere on its own. Hence, the p- and n-layers. These layers, which contain charged dopant ions, set up a strong electric field across the i-layer. It is this electric field which draws the electric charge out of the i-layer and sends it through an external circuit where it can do work (i.e. power a light bulb).

An amorphous silicon solar cell is comprised of a body of hydrogenated amorphous silicon (a-Si:H) material, which can be formed in a glow discharge of silane. Such cells can be of the type described in U.S. Pat. No. 4,064,521 entitled Semiconductor Device Having A Body Of Amorphous Silicon which, issued to David E. Carlson on Dec. 20, 1977. Within the body of the cell there is an electric field which results from the different conductivity types of the semiconductor regions comprising the body.

Amorphous silicon solar cells are often fabricated by the glow discharge of silane ($SiH_4$). The process of glow discharge involves the discharge of energy through a gas at relatively low pressure and high temperature in a partially evacuated chamber. A typical process for fabricating an amorphous silicon solar cell comprises placing a substrate on a heated element within a vacuum chamber. A screen electrode, or grid, is connected to one terminal of a power supply, and a second electrode is connected to the substrate. While silane, at low pressure, is admitted into the vacuum chamber, a glow discharge is established between the two electrodes and an amorphous silicon film deposits upon the substrate.

Amorphous hydrogenated silicon (a Si:H) based solar cell technology is currently the leading candidate for large area, low-cost photovoltaic applications. The basic device structure is a single p-i-n junction or an n-i-p junction in which all layers are traditionally amorphous and are made in a continuous plasma deposition process.

The substrate of the solar cell can be made of glass or a metal, such as aluminum, niobium, titanium, chromium, iron, bismuth, antimony or steel. If a glass substrate is used, a transparent, conductive coating, such as tin oxide ($SnO_2$) can be applied to the glass substrate prior to forming the amorphous silicon. A metallic contact can be formed on the back of the substrate.

The doped layers in the device play a key role in building up the strong internal electric field across the i-layer, which is the predominant force in collecting photocarriers generated in the i-layer. In particular, the doped layers in the recombination junction of a multi-junction solar cell have to support large electric fields extending into the intrinsic layers, in addition to the high field in the recombination junction itself. The interface region must promote efficient recombination of electrons, generated in the first i-layer, with holes from the second i-layer. Also, the tunnel junction layers should provide minimal optical absorption. However, the electrical properties of amorphous doped layers are relatively poor as compared to their crystalline counterparts. For instance, the conductivities are typically only ~1×10$^{-6}$ ($\Omega$·cm)$^{-1}$ for a-Si:H p-layer and ~1×10$^{-4}$ ($\Omega$·cm)$^{-1}$ for the n-layer. This is due partly to the low carrier mobilities in a-Si:H and partly to the low doping efficiencies in the disordered material. Moreover, the extremely high densities of tail states in amorphous materials prevent the Fermi levels from being too close to the band edges. The typical conductivity activation energies for a-Si:H p-layers and n-layers are ~0.4 eV and ~0.2 eV, respectively, thereby limiting the open circuit voltage of the a-Si:H solar cells to ~0.9 V given its bandgap of ~1.75 eV.

At open circuit conditions, the voltage of the multi-junction solar cell should ideally be the sum of voltage developed across each p-i-n junction if there is no voltage dropped across the tunnel junctions. However, for non-ideal tunnel junctions a significant voltage in opposite polarity with that generated by the p-i-n junctions in the device can occur due to accumulation of photocarriers near the tunnel junction, and thus reduce the open circuit voltage.

Another important quality for the doped layers used in solar cells, besides good electrical properties, is low optical absorption. In contrast to single crystalline devices where p-n junctions can be used, photons absorbed in amorphous doped layers can be lost because the diffusion length of photo-carriers is extremely short in those layers. This requirement is especially important for the p-layer through which light enters into the device. It is partly for this reason that amorphous silicon carbon (a-SiC:H) p-layers with an optical bandgap ~2.0 eV have often been used instead of amorphous silicon (a-Si:H) p-layers.

Converting amorphous a-Si:H to $\mu$c-Si also lowers the optical absorption in the short wavelength region due to the selection rule for optical transition in crystalline grains. The absorption coefficient of $\mu$c-Si p-layer is higher than that of the amorphous silicon carbon (a-SiC:H) p-layer typically used in the solar cells. Doped microcrystalline silicon ($\mu$cSi) represents a very attractive alternative for a-Si:H based solar cells not only because of its much improved electrical and optical properties but also its compatibility with the enhanced plasma chemical vapor deposition process. However, except for very few reported successes, microcrystalline silicon so far has not been widely used in amorphous silicon (a-Si:H) solar cells, at least for commercial applications. The main difficulties are perhaps in making extremely thin layers of $\mu$c-Si($\leq$100 Å), which is necessary in order to reduce the optical loss, and in alloying with carbon for raising the optical bandgap.

The bulk properties of microcrystalline silicon ($\mu$c-Si) are very different from those of extremely thin layers made under the same microcrystalline condition. Therefore, the bulk properties of microcrystalline silicon have little relevance to the application of $\mu$c-Si in solar cells where only ultra-thin layers are used. When examining the thickness dependencies of conductivity and activation energy for films made under conventional microcrystalline p-layer conditions, it can be observed that the film properties change dramatically when the microcrystalline thickness is below ~1000 Å. This is not surprising because it is well known that nucleation is critical in forming crystalline grains on a heterogeneous substrate. Also, the properties of those films made under "microcrystalline" conditions may be strongly substrate dependent, especially for ultra-thin layers. Furthermore, whether the substrate is conducting or insulating apparently also influences the initial nucleation of $\mu$c-Si, at least in D.C. plasma. In the past, it has been found that microcrystalline silicon ($\mu$c-Si) forms much more readily on stainless steel substrates than on an amorphous silicon (a-Si:H) layer.

Solar cells made of copper indium diselenide (CIS) and its alloys, such as copper indium gallium selenide (CIGS) can be useful, but usually by themselves produce low voltages and high power ($I^2R$) losses.

It is, therefore, desirable to provide better processes for producing improved monolithic multi-junction solar cells with amorphous silicon and CIS and their alloys.

SUMMARY OF THE INVENTION

Monolithic solar cells are produced which are able to capture a broader spectrum of sun light and convert and harness a greater amount of solar energy into electricity. Advantageously, the monolithic solar cells and process for their production are efficient, effective, reliable, and economical. The monolithic solar cells can comprise: single junction solar cells, tandem solar cells, triple junction solar cells, or other multi-junction solar cells.

As used in this application, the term "monolithic" means a solar cell comprising a front contact and a rear-contact. The segments, layers, or cells of a monolithic solar cell are electrically and optically connected to each other to form one solar cell.

The process for producing the inventive monolithic solar cells comprises coupling an amorphous silicon thin film semiconductor to a copper indium polycrystalline semiconductor by: depositing the copper indium polycrystalline semiconductor on a vitreous substrate or a metal substrate, depositing an n-type conductor on the copper indium polycrystalline semiconductor, and depositing the amorphous silicon thin film semiconductor on the n-type conductor. Preferably, the copper indium polycrystalline semiconductor is deposited by evaporation. The copper indium polycrystalline semiconductor can contain 0% to 24% by weight gallium and preferably comprises copper indium diselenide (CIS) or copper indium gallium selenide (CIGS). In the preferred process, a rear contact is deposited on the substrate before the copper indium polycrystalline semiconductor is deposited, and a front contact is positioned and deposited on the amorphous silicon thin film semiconductor.

In one embodiment, the n-type conductor comprises cadmium sulfide. The cadmium sulfide can be deposited by solution growth, sputtering or evaporation. A transparent conductive oxide, such as zinc oxide or tin oxide, can be deposited on the cadmium sulfide by low pressure chemical vapor deposition (LP CVD). In another embodiment, the n-type conductor comprises microcrystalline n-doped amorphous silicon. The microcrystalline n-doped amorphous silicon can be deposited by enhanced plasma chemical vapor deposition EP CVD), also referred to as plasma enhanced chemical vapor deposition (PE CVD).

The amorphous silicon thin film semiconductor can comprise a p-i-n or n-i-p semiconductor and can be formed of hydrogenated amorphous silicon, hydrogenated amorphous silicon carbon, and/or hydrogenated amorphous silicon germanium. The amorphous silicon thin film semiconductor can be deposited by enhanced plasma chemical vapor deposition.

In a preferred process for producing triple junction solar cells, an amorphous silicon germanium semiconductor is deposited on the n-type conductor by EP CVD, and an amorphous silicon conductor is deposited by EP CVD on the amorphous silicon germanium semiconductor.

The monolithic solar cell can have a metal substrate, made of steel, iron, aluminum, niobium, titanium, chromium, bismuth, or antimony, but preferably comprises a transparent vitreous substrate made of glass. The rear contact can be made of molybdenum, aluminum, silver, zinc oxide or tin oxide. The front contact can be made of zinc oxide, tin oxide or other transparent conductive oxides.

The inventive solar cells and process produced unexpected surprisingly good results. The invention combines a copper indium polycrystaline semiconductor with an amorphous silicon thin film semiconductor in a monolithic manner such that the resultant photovoltaic devices have a high open circuit voltage and a high short circuit current density. The amorphous silicon semiconductor responds and effectively converts up to and primarily from 400 to 900 nanometers (nm) of light to electricity. The CIS or CIGS polycrystalline semiconductor responds and effectively converts the remaining 900–1400 nm of light to electricity. The CIS or CIGS polycrystalline semiconductor combines and cooperates with the amorphous silicon semiconductor to provide synergistic results. The inventive process and solar cells provide better conversion efficiency, fill factor (FF), short circuit current density, and open circuit voltage ($V_{oc}$). Advantageously, the novel process and solar cells are economical, attractive and effective.

The multi-junction solar cells can be fabricated by forming a microcrystalline sandwich with a n-type semiconductor (conductor) comprising a microcrystalline tunnel junction layer between the CIS or CIGS polycrystalline solar cell and an adjoining n-i-p amorphous silicon-containing solar cell. The amorphous silicon-containing solar cell has a positively doped p-layer, an active instrinic i-layer, and a negatively doped n-layer. A tunnel junction or recombination junction connects the polycrystalline back solar cell to the amorphous silicon-containing solar cell. The tunnel junction can comprise a negatively doped layer from one of the solar cells, a positively doped layer from the other solar cell, and at least one intermediate tunnel junction layer positioned between the polycrystalline and amorphous silicon-containing second solar cells.

The tunnel junction layer can be fabricated by etching and treating one of the doped layers in the tunnel junction to form an etched surface thereon and, thereafter, nucleating from the etched surface to form and grow a microcrystalline tunnel junction layer. As used in this application, the term "nucleating" means the initial growth phase of microcrystalline layers. Etching can comprise enhanced plasma chemical vapor deposition with an enchant (treatment material), such as hydrogen, deuterium, HD, helium, and argon. Preferably, etching comprises hydrogen etching alone by DC or RF enhanced plasma chemical vapor deposition while preventing substantial optical and electrical damage to the doped layers. Desirably, for best results, silane or other feedstock is prevented from being deposited with the enchant.

Nucleation from the etched surface can be provided to accelerate microcrystalline growth. Microcrystalline nucleation can be accomplished by enhanced plasma chemical vapor deposition with a dopant and a feedstock diluted with a diluent. The dopant can be: a negative dopant comprising a n-type dopant, such as phosphine ($PH_3$) or other phosphorous-containing compounds; or a positive dopant comprising a p-type dopant, such as diborane ($B_2H_6$), $BF_3$, or other boron-containing compounds. The feedstock can be: silane ($SiH_4$), disilane($Si_2H_6$), tetramethyl silane, $Si(CH_3)_4$, $SiF_4$, $SiHF_3$, $SiH_2Cl_4$, $CH_N(SiH_3)_{4-N}$ wherein N is an integer in the range of 0 to 3, a carbon based feedstock; or a germanium based feedstock. The feedstock can also have the general formula $Si_N H_{2N+2-M} Y_M$ wherein:

Si=silicon
H=hydrogen or deuterium
Y=a halogen [fluorine (F), chlorine (Cl), bromine (Br), Iodine (I), etc.]
N=positive integer$\geq 1$
M=positive integer; and
2N+2-M$\geq$0.

The diluent can be hydrogen ($H_2$), deuterium ($D_2$), or HD. The dilution ratio of the diluent to the feedstock can range from about 50:1 to about 200:1.

Plasma enhanced chemical vapor deposition (PECVD) can be by: cathodic direct current (DC) glow discharge, anodic DC glow discharge, radio frequency (RF) glow discharge, very high frequency (VHF) glow discharge, alternating current (AC) glow discharge, or microwave glow discharge. Plasma enhanced chemical vapor deposition of microcrystalline layers can be accomplished at a temperature ranging from 80–300° C., at a pressure ranging from 0.5–5 Torr, with a dilution ratio of diluent to the feedstock (deposition gas) ranging 50:1 to 200:1.

As discussed above, the tunnel junction of the multi-junction solar cell can have an etched surface and at least one microcrystalline tunnel junction layer sandwiched between the doped layer of one solar cell and an opposite doped layer of the other solar cell. The etched surface can be a hydrogen plasma etched surface, such as a n-doped amorphous silicon surface or a p-doped amorphous silicon surface. The microcrystalline tunnel junction layer can be a p-type microcrystalline layer and/or an n-type microcrystalline layer and the microcrystalline layer can be microcrystalline silicon carbon, microcrystalline silicon germanium, or microcrystalline silicon. Desirably, the microcrystalline layer can have a thickness of 50–120Å, preferably from 80–100Å for best results. The tunnel junction can comprise an n-type doped non-crystalline amorphous layer, an n-type microcrystalline tunnel junction layer, and a p-type doped non-crystalline amorphous layer. Tunnel junction can also comprise a p-type microcrystalline tunnel junction layer in lieu of or in addition to the n-type microcrystalline tunnel junction layer.

Preferably, the solar cells include an n-i-p amorphous silicon-containing solar cell and a copper indium diselinide (CIS) solar cell or a copper indium gallium selenide (CIGS) solar cell. At least one of the layers of the amorphous silicon-containing solar cell;, i.e. the n layer, i layer, and/or p layer, in one the solar cells comprises: hydrogenated amorphous silicon, hydrogenated amorphous silicon carbon, or hydrogenated amorphous silicon germanium.

A more detailed explanation of the invention is provided in the following description and appended claims taken in conjunction with the accompanying drawings.

DETAILED DESCRIPTION OF THE PREFERRED EMBODIMENTS

Figure 1:
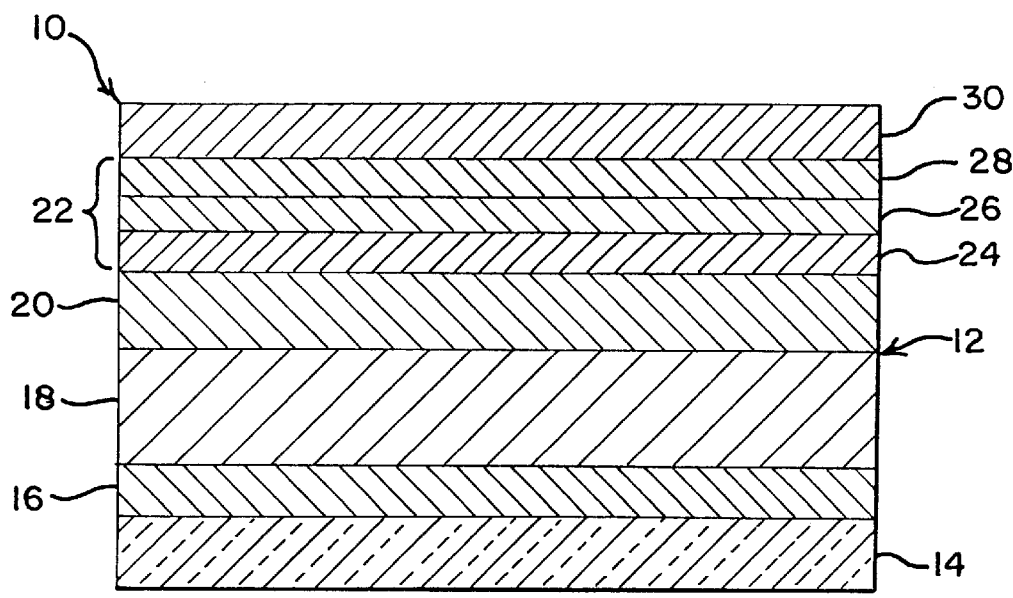
FIG. 1 is a cross-sectional view of a monolithic multi-junction solar cell in accordance with principles of the present invention.

The monolithic photovoltaic device 10 of FIG. 1 provides a photovoltaic module which comprises a tandem multi-junction solar cell 12. The solar cell has a generally planar or flat substrate 14 which can be made of metal, such as stainless steel, iron, aluminum, niobium, titanium, chromium, bismuth, or antimony, but is preferably a vitreous substrate made of opaque glass, translucent glass, or most preferably, transparent glass. A rear contact 16 (back contact) is disposed, deposited, positioned and lies upon the substrate. The rear contact can comprise aluminum, silver, platinum, zinc oxide, tin oxide, or preferably molybdenum.

A copper indium polycrystalline semiconductor back or rear cell 18 (FIG. 1) is positioned on and connected to the rear contact on the substrate. The polycrystalline back cell or back segment comprises a copper indium polycrystalline semiconductor with a bandgap ranging from 1 eV to 1.2 eV. The copper indium polycrystalline semiconductor can comprise copper indium diselenide (CIS) with a bandgap of 1 to 1.04 eV or copper indium gallium selenide (CIGS) with a bandgap of 1 to 1.2 eV. The CIGS semiconductor can have 0.1% to 24% by weight gallium. Generally, the greater the amount of gallium, the higher the bandgap. There are situations when CIGS is preferred over CIS and vice versa.

An n-type (negative type) conductor or semiconductor 20 (FIG. 1) provides an n-doped (negative-doped) connector and tunnel junction which is sandwiched and positioned between and operatively connected to the copper indium polycrystalline back cell and an amorphous silicon front or top cell 22. The n-type conductor can comprise cadmium sulfide. A transparent conductive oxide, such as tin oxide or preferably zinc oxide, can cover and be positioned between and connected to the cadmium sulfide and the amorphous silicon from cell. Preferably, the n-type conductor comprises microcrystalline n-doped (negatively doped) amorphous silicon providing a microcrystalline n-layer ($\mu$n layer). The $\mu$n layer can have a thickness of about 50 Å to 120Å, preferably 80 Å to 100 Å.

The use of microcrystalline silicon in the doped layers of the recombination junction can offer many advantages: (1) the higher carrier density generally available in microcrystalline versus amorphous silicon more easily supports the high electric fields required while using very thin layers; (2) more efficient recombination occurs due to the smaller mobility gap and the increased doping density, as well as to increased tunneling in the very thin layers; and (3) the optical absorption loss due to the tunnel junction layers can be reduced because of the lower absorption coefficient of microcrystalline silicon ($\mu$c-Si) in the visible wavelengths as well as because of the use of thinner layers. The high doping density and high electric field associated with the use of microcrystalline silicon ($\mu$c-Si) can improve open circuit voltage ($V_{oc}$). More efficient recombination in the tunnel junction will minimize charge accumulation near that junction. Furthermore, the short circuit current of the tandem device may be increased by use of microcrystalline tunnel junction layers.

The amorphous silicon semiconductor front cell 22 (FIG. 1) provides a p-i-n or preferably an n-i-p amorphous silicon thin film semiconductor with a bandgap ranging from about 1.4 eV to 1.75 eV, usually to 1.6 eV. The amorphous silicon semiconductor or front segment can comprise: hydrogenated amorphous silicon, hydrogenated amorphous silicon carbon or hydrogenated amorphous silicon germanium. The positively doped (p-doped) amorphous silicon p layer 24 of the amorphous silicon semiconductor is positioned, disposed and deposited on, covers, lies upon, and is connected to the n-type conductor 20. The p layer can be positively doped with diborane ($B_2H_6$), $BF_3$ or other boron-containing compounds. An amorphous silicon, undoped, active intrinsic i-layer 26 is deposited upon, positioned between and connected to the p layer and a negatively doped. (n-doped) amorphous silicon n layer 28. The n layer is positioned on the i layer and can comprise amorphous silicon carbon or amorphous silicon negatively doped with phosphine ($PH_3$) or some other phosphorous-containing compound.

Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Angstroms (Å), preferably less than 150 Å, the diborane flow is stopped to form an intrinsic region having a thickness on the order of a few 1000 Angstroms, preferably 2500–4500 Å. Thereafter, an n-type dopant, such as phosphine ($PH_3$), is added to the silane flow in order to form an n-type amorphous silicon layer having a thickness of a few 100 Angstroms, preferably less than 150 Å. The p-i interface can be amorphous silicon carbon containing perhaps 5% carbon at the edge of the p-layer. The composition is then linearly graded until it contains no carbon at the i-layer edge. However, there are many ways to make a p-i interface, not all of which involve grading or using carbon.

A front contact 30 (FIG. 1) is deposited and positioned upon and connected to the amorphous silicon n-layer of the front cell. The front contact can comprise a transparent conductive oxide, such as tin oxide and preferably zinc oxide, having a thickness less than 2000 Å. For best results, a metal or glass superstrate is not placed or positioned upon the front contact so that the photovoltaic device operates in the absence of a glass superstrate as well as without a metal superstrate.

There are many advantages to the tandem cells of FIG. 1. The first is light absorption. The different amorphous alloys absorb different parts of the solar spectrum. Amorphous silicon carbon (a-SiC) absorbs ultraviolet (UV) light efficiently while passing most visible and all infrared light. Amorphous silicon (a-Si) absorbs UV light (but not as efficiently as a-SiC), absorbs visible light efficiently, but does not absorb much infrared (IR) light. Amorphous silicon germanium (a-SiGe) absorbs IR efficiently and UV and visible light generally inefficiently. CIS and CIGS absorb the remaining light in the range from 900 to 1400 nm. Another benefit of tandem solar cells is that each layer (junction) can have a different absorbing layer, so that virtually all wavelengths of light can be absorbed efficiently. A further benefit of tandem cells is that because the absorbing layers are tailored to the solar spectrum and absorb light efficiently, they can be thinner. Thinner layers are more stable with respect to the Staebler-Wronski effect.

Figure 2:
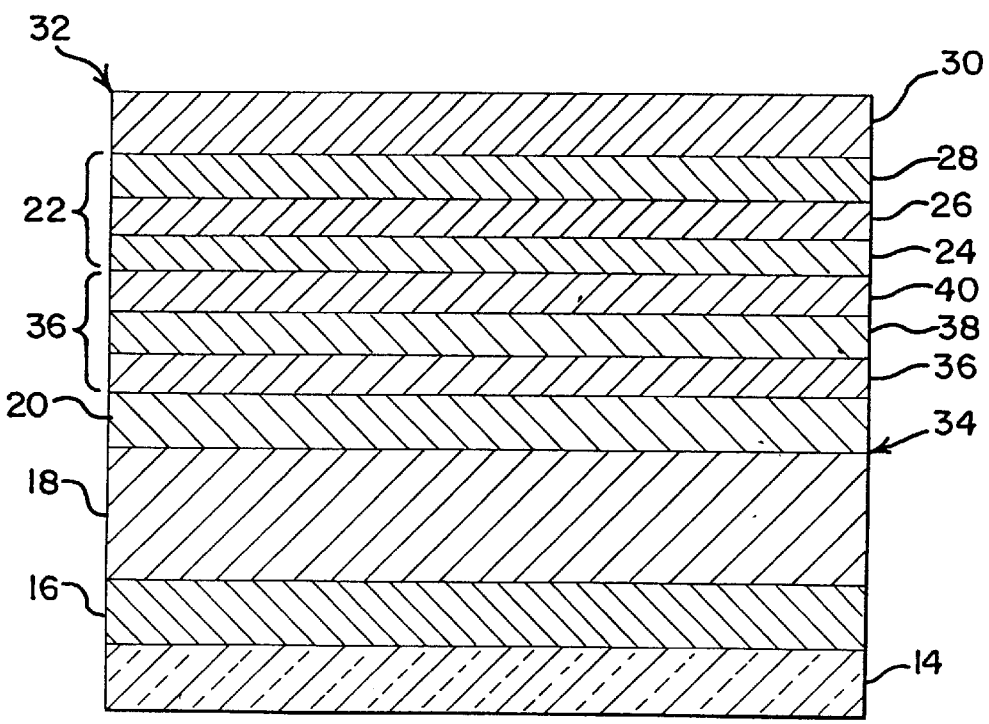
FIG. 2 is a cross-section view of a monolithic triple junction solar cell in accordance with principles of the present invention.

The monolithic photovoltaic device 32 of FIG. 2 comprises a triple junction solar cell 34. The triple junction solar cell of FIG. 2 is generally structurally, physically and functionally similar to the tandem junction solar cell of FIG. 1, except as explained below. For ease of understanding, similar components and parts of the solar cells of FIGS. 1 and 2 have been given similar part numbers, such as substrate 14, rear contact 16, CIS or CISG back cell 18, n-type conductor 20, amorphous silicon front cell 22 and front contact 30. An intermediate middle amorphous silicon semiconductor cell 36 is sandwiched and positioned between and operatively connected to the front cell and the n-type conductor. The intermediate middle amorphous silicon cell can be similar to the amorphous silicon front cell described above. The intermediate middle amorphous silicon cell or segment has a bandgap of about 1.4 eV to 1.75 eV, usually to 1.6 eV and preferably comprises hydrogenated amorphous silicon germanium with a bandgap of 1.4 eV. The amorphous silicon positively doped p-layer of the front cell is positioned upon and connected to the amorphous silicon negatively doped n-layer 40 of the intermediate middle cell. The amorphous silicon positively doped p-layer 36 of the intermediate middle cell is deposited and positioned upon and connected to n-type conductor 20. The amorphous silicon intrinsic i-layer 38 of the intermediate middle cell is sandwiched and positioned between and connected to the n-layer and p-layer of the intermediate middle cell. The front cell of the triple junction solar cell can have a bandgap of 1.4 eV to 1.75 eV and preferably comprise hydrogenated amorphous silicon with a bandgap of 1.6 to 1.75.

In multi-junction solar cells, the i layer of the amorphous silicon containing cells can comprise an active hydrogenated compound, such as amorphous silicon, amorphous silicon carbon or amorphous silicon germanium. The active p layer of the amorphous silicon-containing cells can comprise a p-doped hydrogenated compound, such as p-doped amorphous silicon, p-doped amorphous silicon carbon or p-doped amorphous silicon germanium. The active n layers of the amorphous silicon-containing cells can comprise a n-doped hydrogenated compound, such as n-doped amorphous silicon, n-doped amorphous silicon carbon or n-doped amorphous silicon germanium.

In order to obtain better utilization of the solar spectrum and to improve stability, two or more p-i-n junctions with i-layer materials of different bandgaps can be built in series to form a monolithic triple junction solar cell. The interface between the two amorphous silicon junctions, often called the tunnel junction or recombination junction, can also be a microcrystalline tunnel junction.

In operation, sunlight or light from other sources, enters the top of the monolithic solar cell and passes through the transparent conductive oxide comprising the front contact. The light then through the amorphous silicon front cell. Much, if not most, of the light in the bandgap of 400 to 900 nanometers (nm) are captured, absorbed and converted to electricity by the amorphous silicon front cell. The light then passes through the optional amorphous silicon germanium middle cell. Most, if not all, of the remaining light in the bandgap of 400 to 900 nm are captured, absorbed and converted to electricity by the amorphous silicon germanium middle cell. The remaining light then passes through the CIS or CIGS polycrystalline back (rear) cell where much, if not most of the light in the bandgap over 900 nm and primarily 900–1400 nm, are captured, absorbed and converted to electricity. Depending on the composition (material) of the rear contact and substrate, any remaining light will either be reflected back to the rear (back) cell for further conversion, if the rear contact or substrate is reflective, shiny and opaque, or any remaining light will exit the solar cell if the rear contact is transparent, such as transparent conductive oxide, and the substrate is made of transparent or translucent glass. The combination and interaction of the amorphous silicon-containing cells and the CIS or CIGS polycrystalline cells achieve a higher overall conversion of solar energy and light to electricity and produce a synergistic effect not provided by cells made only of amorphous silicon, CIS or CIGS and their alloys.

Because the polycrystalline CIS or CIGS back cell is interconnected to the amorphous silicon front cell, the polycrystalline CIS or CIGS back cell can have some impurities, voids, or deviations without substantially impairing the overall performance of the monolithic multi-junction solar cell. Furthermore, the above described arrangement of coupling amorphous silicon semiconductor cells and their alloys to CIS or CIGS polycrystalline semiconductor cells produces greater current than amorphous silicon cells without CIS or CIGS but without the power ($I^2R$) losses of CIS and CIGS solar cells without amorphous silicon or their alloys.

The bandgap and characteristics of the polycrystalline back cell can be varied, fined tuned, and controlled by changing the amount of germanium in the polycrystalline back cell. A CIS back cell can have a bandgap of 1 to 1.04 eV. A CIGS back cell with 20–24% by weight gallium can have a bandgap as high as 1.2 eV. Decreasing the amount of gallium in the CIGS back cell can alter and control the bandgap of the back cell to a desired level between 1 and 1.2 eV.

The bandgap and characteristics of the thin film front cell and thin film middle cell can be varied, fine tuned and controlled by changing the composition or thickness of the amorphous silicon and by using different alloys, to attain the desired levels between 1.4 to 1.75 eV.

It is therefore, apparent that the resulting optical bandgap and electrical characteristics of the monolithic multi-junction solar cell can be varied, fine tuned and controlled, in the preceding manner, to achieve the desired electrical properties.

The process for producing multi-junction solar cells includes depositing, placing and securing a rear contact to a metal substrate and preferably a vitreous substrate. While the rear contact can be made of aluminum, silver, tin oxide, or zinc oxide, it is preferred to use molybdenum or platinum because of their ability to withstand high temperatures required during the deposition of CIS or CIGS. Aluminum contacts have a tendency to corrode at higher temperatures. Molybdenum rear contacts can be deposited by sputtering or by other methods.

In order to obtain a polycrystalline semiconductor back cell with a bandgap ranging from 1 to 1.2 eV, CIS or CIGS is deposited upon, covers and is connected to the rear contact on the substrate by evaporation at a temperature ranging from 400° C. to 500° C. The bandgap of the polycrystalline back cell can be varied to the desired level between 1 to 1.2 eV by varying the amount of gallium from 0 to 24% by weight, as explained above.

A negative doped, n-type conductor (semiconductor) is deposited upon, covers, and is connected to the CIS or CIGS polycrystaline back cell. Cadmium sulfide (CdS) can be used as the n-type conductor and can be deposited by sputtering, evaporation, or preferably solution growth. A transparent conductive oxide, such as tin oxide or preferably zinc oxide, can be deposited on the cadmium sulfide by low pressure chemical vapor deposition (LP CVD).

Preferably, the negatively doped, n-type conductor comprises microcrystalline negatively doped (n-doped) amorphous silicon, which is deposited by enhanced plasma chemical vapor deposition (EP CVD). The n-type conductor serves to couple, secure and connect the back cell to the front or middle cells (segments).

One or more amorphous silicon containing, thin film semiconductor cells are deposited upon, covers and connected to the n-type connector by enhanced plasma chemical vapor deposition (EP CVD), such as at a temperature of about 180° C. to about 200° C. The amorphous silicon-containing cells can comprise: hydrogenated amorphous silicon, hydrogenated amorphous silicon carbon, or hydrogenated amorphous silicon germanium, and combinations thereof. For tandem or dual junction, monolithic solar cells, the amorphous silicon-containing solar cell preferably comprises a n-i-p from cell.

The n-i-p solar cell can be formed by depositing: a negatively doped n layer on the preceding layer, e.g. n-type conductor; an active intrinsic i layer on the h layer, and a positively doped p layer on the i layer.

For triple junction monolithic solar cells, a middle intermediate amorphous silicon-containing n-i-p semiconductor cell is preferably deposited upon, covers and is connected to the n-type conductor by EP CVD and the front, amorphous silicon-containing, n-i-p semiconductor cell is preferably deposited on the middle intermediate cell by EP CVD. In the preferred triple junction solar cell, the middle intermediate cell has a bandgap of 1.4 to 1.75 eV, preferably to about 1.6 eV, and comprises hydrogenated amorphous silicon germanium; and the front cell has a bandgap of 1.4 eV and comprises hydrogenated amorphous silicon.

The $n_1$ and $n_2$ layers of the amorphous silicon-containing cells can be formed by enhanced plasma enhanced chemical vapor deposition with a n-type dopant, such as phosphine ($PH_3$) or other phosphorous-containing compounds. The $p_1$ and $p_2$ layers of the amorphous silicon-containing cells can be formed by enhanced plasma chemical vapor deposition with a p-type dopant, such as diborane ($B_2H_6$), $BF_3$, or other boron-containing compounds.

Plasma enhanced chemical vapor deposition can comprise DC or RF glow discharge under the following conditions: a temperature of the substrate ranging from about 80° C. to about 300° C.; a pressure ranging from about 0.5 to about 5 Torr; and a power density ranging from about 50 to about 230 mW/cm$^2$.

A front contact is placed and deposited upon and secured to the top n-layer of the front cell. The front contact can comprise transparent conductive oxide, such as tin oxide or preferably zinc oxide, which is preferably deposited by low pressure chemical vapor-deposition (LP CVD) or by other methods.

The top layer of the CIS or CIGS polycrystalline back cell can be treated with a hydrogen plasma etch, preferably without silane, for a period of about 150 to about 750 seconds without damaging the optical and electrical properties of the CIS or CIGS polycrystalline cell. Thereafter, the hydrogen treated layer of the polycrystalline cell can be nucleated with a negatively doped hydrogen plasma and a silicon-containing feedstock to form a negatively doped, microcrystalline tunnel junction or microcrystalline recombination junction ($\mu$n) layer having a thickness of about 50 Å to about 120Å, preferably about 80 Å to about 100 Å.

The microcrystalline tunnel junction layer can also comprise a composite microcrystalline tunnel junction or composite microcrystalline recombination junction layer. The composite microcrystalline tunnel junction layer can comprise a negatively doped microcrystalline tunnel junction ($\mu$n-type) layer and a positively doped microcrystalline tunnel junction ($\mu$p-type) layer. The negatively doped microcrystalline tunnel junction $\mu$n-layer can be disposed between the n layer of the amorphous silicon-containing cell and the positively doped microcrystalline tunnel junction $\mu$p-layer. The positively doped microcrystalline tunnel junction $\mu$p-layer can be disposed between the $\mu$n-layer and the p-layer of the polycrystalline cell. The tunnel junction can be doped with phosphine, such as at the following ratio: 10,000 hydrogen: 100 silane: 2 phosphine. The microcrystalline tunnel junction layer can also include a microcrystalline tunnel junction $\mu$p-layer comprising p-doped microcrystalline silicon. The p-layer can comprise p-doped amorphous silicon.

The surface of the amorphous silicon i-layer can be etched for a period of about 300 to about 500 seconds with a hydrogen plasma etchant. The n-type doped layer can be nucleated to form an n-type microcrystalline silicon layer having a thickness of about 80 Å to about 100 Å. A microcrystalline tunnel junction $\mu$p-layer can be formed by subjecting the microcrystalline tunnel junction $\mu$n-layer to a positively doped hydrogen plasma and a silicon-containing feedstock to form the microcrystalline tunnel junction $\mu$p-layer on the microcrystalline tunnel junction $\mu$n-layer. Hydrogen plasma etching provides a relatively fast nucleation period and a speedy induction time for microcrystalline growth. Surface treatment by plasma etching, such as hydrogen plasma deposition, provides uniformly etched and smooth surfaces without damaging the optical and electrical properties or detracting from the appearance of the photovoltaic device. It is believed that plasma etching does not crystallize the surface, but serves as a catalyst and promoter to enhance microcrystalline nucleation and growth.

At least one of the doped layers of the amorphous silicon-containing solar cells can also comprise a microcrystalline doped layer which is positioned adjacent to and abuts against the etched surface of the i-layer. Desirably, the microcrystalline doped layer has a thickness of about 50 Å to about 120Å. The microcrystalline doped layer, microcrystalline tunnel junction layer or microcrystalline recombination junction layer should be thin, preferably 50–120Å, and most preferably 80–100 Å to: (1) establish an electrical field inside the intrinsic i-layer, (2) increase reflection of light to the i-layer, and (3) minimize absorption. Preferably, the etched surface of the i-layer in the solar cell comprises a hydrogen etched surface without silane so as to promote nucleation of the subsequently deposited microcrystalline doped layer. The microcrystalline silicon ($\mu$c-Si) after etching can improve the conversion efficiency of the tandem amorphous silicon (a-Si:H) solar cell by more than 10%.

Table 1 below summarizes the typical condition and duration for the $H_2$ plasma treatment to promote fast nucleation of $\mu$c-Si layer. It should be noted that a minimum duration of $H_2$ plasma treatment (hydrogen etching) is desirable in order to allow immediate nucleation of subsequently deposited $\mu$c-Si layer. The minimum duration of hydrogen etching ($H_2$plasma) is about 150 seconds, depending on the plasma condition.

TABLE 1

| Typical condition for $H_2$ plasma treatment | | | | |
|---|---|---|---|---|
| Temperature (° C.) | Pressure (Torr) | $H_2$ flow rate (sccm) | Power density (mW/cm$^2$) | Duration (sec) |
| 80–300 | 0.5–5 | 100–2000 | 50–230 | 150–750 |

TABLE 2

Typical condition for μc-Si layer deposition

| Temperature (° C.) | Pressure (Torr) | Power Density (mW/cm²) | H₂/SiH₄ ratio |
|---|---|---|---|
| 80–300 | 0.5–5 | 50–230 | 50–200:1 |

Tandem and other multi-junction solar cells are intrinsically more stable than single-junction photovoltaic devices with the same light absorbing capabilities. Multi-junction solar cells can have layers of hydrogenated amorphous silicon separated by a tunnel junction and arranged in a stacked configuration. The thickness of the layers can be adjusted to maximize efficiency and equalize the current generated in each layer. The multi-junction solar cells can have the bandgap of the amorphous silicon layers varied by adjusting the hydrogen concentration in the amorphous silicon layers.

The most significant measure of a solar cell is its conversion efficiency. The conversion efficiency is the percentage of the energy of the light impinging on the cell converted to electrical energy which can be used by an external load, e.g. light bulb.

The energy in sunlight (striking a flat surface at solar noon) is about 100 mW/cm². For convenience solar simulators are calibrated so that the energy that they radiate is as close as possible to 100 mW/cm². Therefore, the procedure is to measure how much energy is being produced by the cell when illuminated.

The output of a solar cell can be determined by: $V_{oc}$=open circuit voltage, $P_{max}$=maximum solar cell power and $J_{sc}$=short circuit current. The cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\text{Efficiency }(\%) = (P_{max}/P_{incident}) \times 100 = (P_{max}/100) \times 100 = P_{max}$$

$$\text{Efficiency} = P_{max} = V_{max} \times J_{max} = V_{oc} \times J_{sc} \times FF$$

$V_{oc}$=Open circuit voltage, i.e. the voltage developed by cell in situation where no current is drawn (cell is open circuited). If you measure the voltage across the terminals of your car battery with a voltmeter, you will be measuring the open circuit voltage (a little over 12 V).

$J_{sc}$=Short circuit current, i.e. the current passed by cell if it is short circuited. If you drop a wrench across the terminals of your car battery, you will be passing the short circuit current (hundreds of amps) through the wrench. Short circuit currents on solar cells are much smaller and not nearly as dangerous.

$$FF = \text{ratio of } P_{max} \text{ to } V_{oc} \times J_{sc}$$

Efficiency is really given by: Efficiency=$(P_{max}/P_{incident}) \times$ 100. However, in practice $P_{incident}$ (power of light incident on cell) is set to 100 so that efficiency=$P_{max}$ Fill factor (FF) is a number used to express efficiency in terms of open circuit voltage ($V_{oc}$) and short circuit current ($J_{sc}$).

Alternative Feedstocks

While silane and hydrogen are the preferred feedstocks for amorphous silicon cells, there are many alternative feedstocks for undoped plasma-enhanced chemical vapor deposition (CVD) glow discharge a-Si:H and a-SiC:H alloys. The diluent hydrogen (H₂) can be replaced by deuterium (D), with the diluent gas being HD or D₂. The alternative feedstocks for silane (SiH₄), in addition to SiH₄ or instead of SiH₄, can be expressed by the following general formula: $Si_N H_{2N+2-M} Y_M$, where Si is silicon, H is hydrogen or deuterium, Y is a halogen, e.g. fluorine (F), chlorine (Cl), etc., N and M are positive integers under the constraint that N≧1 and 2N+2-M≧0. The examples of the above expression include silane (SiH₄), N=1, M=0, disilane (Si₂H₆), N=2, M=0, SiF₄ (N=1, M=4, Y=fluorine), SiHF₃ (N=1, M=3, Y=fluorine), Si₂H₂Cl₄ (N=2, M=4, Y=chlorine), tetramethyl silane, etc. When the alternative Si feedstocks are used, the optimal or preferred deposition conditions may have to be adjusted.

For hydrogenated amorphous silicon carbon (a-SiC:H) deposition, the alternative carbon feedstocks are numerous indeed. In general, most typical hydrocarbons or hydrogen-halogen-carbon compounds can be used, e.g. CH₄, C₂H₂, C₂H₄, C₂H₆, CF₄, C₃H₈, CDCl₃. Other carbon feedstocks can be used which contain built-in carbon-silicon bonds, which can be expressed by the formula: $CH_N(SiH_3)_{4-N}$, where N is an integer in the range of 0 to 4, e.g. CH₃SiH₃ (methylsilane or silylmethane), CH₃(SiH)₃ (trisilymethane). The H in the second compound (SiH₃) in the above formula can be replaced by a halogen, e.g. CH(SiF₃)₃. When an alternative carbon feedstock is used in addition to or in place of methane (CH₄), the deposition parameters such as H₂-dilution ratio and power density can be adjusted accordingly. In the process, deposition conditions of high pressure, low temperature and high diluent concentrations are used to attain stable solar cells with high open circuit voltages ($V_{oc}$) and high fill factors (FF).

The absence of significant amounts of carbon radicals in amorphous silicon carbon can enhance microcrystalline silicon formation as can very high H₂-dilution. The deposition process may be applied to a-Si:H or other materials deposition using enhanced plasma CVD. This process covers the direct and remote plasma-CVD deposition of any material under conditions similar to those described above. Deposition parameters such as power density or electrical bias may be varied, if desired. Increased hydrogen dilution can improve a-SiC:H wide-gap material. Hydrogen plasma etching can provide good surface coverage by the hydrogen during growth, so as to attain higher surface mobility of growth pre-cursers and a better chance of hydrogen compensation of defects in microcrystalline tunnel junctions. Hydrogen plasma etching can also provide more uniform growth and less ion bombardments at the growth surface.

TABLE 3

RF Deposition Conditions

| Deposition Parameter | Broad Range | Intermediate Range | Preferred Range |
|---|---|---|---|
| RF Power density (mW/cm²) | 5–1000 | 20–150 | 40–80 |
| Substrate Temperature (° C.) | 20–250 | 80–180 | 120–150 |
| Deposition Pressure (Torr) | 0.2–50 | 0.5–20 | ~6–12 |
| H₂ (hydrogen) dilution ratio | 5–1000 | 20–400 | 40–200 |
| Total gas flow rate (sccm) | 10–10,000 | 50–4,000 | 1,000–2,500 |

TABLE 3-continued

| | RF Deposition Conditions | | |
|---|---|---|---|
| Deposition Parameter | Broad Range | Intermediate Range | Preferred Range |
| Deposition rate (Å/sec) | 0.1–20 | 0.3–4.0 | 0.5–2.5 |
| AC power frequency (MHZ) | 0.1–10,000 | 2–500 | 10–100 |
| Electrode spacing (cm) | 0.2–10 | 0.5–4 | 1.2–2.5 |

EXAMPLE 1

A tandem dual junction monolithic solar cell was prepared as described above. A glass substrate was coated with molybdenum on its upper (top) surface. The molybdenum provided the rear (back) contact. CIS polycrystalline was deposited by evaporation of the molybdenum rear contact on the glass substrate. A cadmium sulfide (CdS) n-type conductor was deposited on the CIS polycrystalline back cell by solution growth. Zinc oxide was deposited on the CdS by low pressure chemical vapor deposition (LP CVD). A n-i-p amorphous silicon front cell was deposited by enhanced plasma chemical vapor deposition (EP CVD) on the zinc oxide coating of the CdS n-type conductor. A transparent conductive oxide (TCO) front contact was deposited on the n-i-p amorphous silicon front cell by LP CVD. The resultant tandem dual junction monolithic solar cell was tested and had: a conversion efficiency of 9.3%, an open circuit voltage (Voc) of 1.081 volts, a short circuit current (Jsc) density of 14.9 A/cm$^2$, and a fill factor (FF) of 57.6%.

EXAMPLE 2

A tandem dual junction monolithic solar cell was prepared in a manner similar to Example 1, except that the n-type conductor comprised a microcrystalline n-type amorphous silicon instead of CdS coated with zinc oxide. The microcrystalline n-type (n-doped) amorphous silicon was deposited on the CIS polycrystalline back cell by EP CVD. The n-layer of the n-i-p amorphous silicon-containing front cell comprised hydrogenated amorphous silicon carbon, which was deposited by EP CVD. The resultant tandem dual junction monolithic solar cell was tested and had: a Voc of 800 mV (0.8 volts), a current density of 13.5 mA/cm$^2$, and a fill factor of 70.6%. The solar cell functioned somewhat similar to a single junction solar cell.

EXAMPLE 3

A tandem dual junction monolithic solar cell was prepared in the manner described in Example 1, except the CdS n-type conductor was not coated with zinc oxide. The n-layer of the n-i-p amorphous silicon-containing front cell comprised hydrogenated amorphous silicon carbon, which was deposited by EP CVD. The resultant tandem dual junction monolithic solar cell was tested and performed similar to the monolithic solar cell of Example 1, except it had a lower fill factor (FF).

EXAMPLE 4

Another tandem dual junction monolithic solar cell was prepared in a manner similar to Example 1. The resultant tandem dual junction monolithic solar cell was tested and had: a conversion efficiency of 9.3% an open circuit voltage (Voc) of 1.089 volts, a short circuit current (Jsc) density of 16.9 mA/cm$^2$ and a fill factor (FF) of 57.6%.

There are many advantages of photovoltaic devices comprising monolithic multi-junction solar cells with amorphous silicon and CIS and their alloys:
 1. Superior electrical capabilities.
 2. Excellent ability to capture and convert a broader spectrum of sunlight into electricity.
 3. Outstanding flexibility to fine tune and control the electrical properties of the solar cell.
 4. Greater power and short circuit current density.
 5. Higher conversion efficiency and open circuit voltage.
 6. Better conductivity.
 7. Lower activation energy.
 8. Closer to valence and energy bands.
 9. Enhanced ohmic contact and hole properties.
 10. More efficient to establish electrical fields.
 11. Higher mobility of electrons.
 12. Good fill factor.

Although embodiments of this invention have been shown and described, it is to be understood that various modifications and substitutions, as well as rearrangements of parts, components, and process steps can be made by those skilled in the art without departing from the novel spirit and scope of this invention.

What is claimed is:

1. A monolithic solar cell, comprising:
 a vitreous substrate comprising glass;
 a first semiconductor comprising a copper indium polycrystalline semiconductor, said copper indium polycrystalline semiconductor disposed on said vitreous substrate comprising glass, and said copper indium polycrystalline semiconductor being selected from the group consisting of copper indium diselenide (CIS) and copper indium gallium selenide (CIGS);
 a second semiconductor comprising an n-i-p or p-i-n amorphous silicon-containing thin film semiconductor, said second semiconductor comprising said n-i-p or p-i-n amorphous silicon-containing thin film semiconductor disposed above said first semiconductor comprising said copper indium polycrystalline semiconductor;
 an n-type conductor comprising microcrystalline n-doped amorphous silicon or cadmium sulfide, said n-type conductor positioned between and coupling said first semiconductor comprising said copper indium polycrystalline semiconductor and said second semiconductor comprising said n-i-p or p-i-n amorphous silicon-containing thin film semiconductor; and
 said vitreous substrate, copper indium polycrystalline semiconductor, n-i-p or p-i-n amorphous silicon-containing thin film semiconductor, and said n-type conductor comprising said microcrystalline n-doped amorphous silicon or cadmium sulfide, cooperating with each other for providing a monolithic solar cell.

2. A monolithic solar cell in accordance with claim 1 wherein:
 a rear contact is positioned between and connected to at least a portion of said first semiconductor comprising said copper indium polycrystalline semiconductor and said vitreous substrate;
 said rear contact is selected from the group consisting of molybdenum, aluminum, silver, platinum, zinc oxide, and tin oxide;

a front contact is positioned on and connected to at least a portion of said second semiconductor comprising said n-i-p or p-i-n amorphous silicon-containing thin film semiconductor, said front contact comprising a transparent conductive oxide selected from the group consisting of zinc oxide and tin oxide; and said n-i-p or p-i-n amorphous silicon-containing thin film conductor is selected from the group consisting of hydrogenated amorphous silicon, hydrogenated amorphous silicon carbon, and hydrogenated amorphous silicon germanium.

3. A monolithic solar cell in accordance with claim 1 wherein:

said n-type conductor comprises cadmium sulfide and a transparent conductive oxide positioned between and connected to said cadmium sulfide and said amorphous silicon-containing thin film semiconductor;

said transparent conductive oxide of said n-type conductor is selected from the group consisting of zinc oxide and tin oxide; and said transparent conductive oxide of said n-type conductor is positioned between and spaced from said front contact and said rear contact.

4. A monolithic solar cell in accordance with claim 1 wherein:

said solar cell comprises a monolithic triple junction solar cell;

said second semiconductor comprising said amorphous silicon-containing thin film semiconductor is a n-i-p semiconductor comprising hydrogenated amorphous silicon germanium; and said triple junction solar cell includes a third semiconductor comprising hydrogenated amorphous silicon germanium.

5. A monolithic triple-junction solar cell, comprising:

a glass substrate;

a rear contact positioned on said glass substrate, said rear contact being selected from the group consisting of molybdenum, aluminum, silver, zinc oxide, and tin oxide;

a polycrystalline back cell positioned on said rear contact, said polycrystalline back cell having a bandgap ranging from 1 eV to 1.2 eV, said polycrystalline back cell being connected to said rear contact on said glass substrate, said polycrystalline back cell being selected from the group consisting of copper indium diselenide (CIS) and copper indium gallium selenide (CIGS), and said copper indium gallium selenide comprising 0.1% to 24% by weight gallium;

a microcrystalline n-layer positioned on said polycrystalline back cell, said microcrystalline n-layer comprising microcrystalline n-doped silicon;

an intermediate n-i-p amorphous silicon cell positioned on said microcrystalline n-layer, said intermediate n-i-p amorphous silicon cell comprising hydrogenated amorphous silicon germanium with a bandgap ranging from 1.4 eV to 1.6 eV;

a front n-i-p amorphous silicon cell positioned on said intermediate n-i-p amorphous silicon cell, said front n-i-p amorphous silicon cell comprising hydrogenated amorphous silicon with a bandgap of 1.4 eV; and a front contact positioned on and operatively connected to said front n-i-p amorphous silicon cell, said front contact comprising a transparent conductive oxide selected from the group consisting of zinc oxide and tin oxide.

\* \* \* \* \*